United States Patent
Wu et al.

(10) Patent No.: US 9,989,850 B2
(45) Date of Patent: Jun. 5, 2018

(54) PHOTORESIST SYSTEM AND METHOD

(71) Applicant: Taiwan Semiconductor Manufacturing Company, Ltd., Hsin-Chu (TW)

(72) Inventors: Chen-Hau Wu, New Taipei (TW); Ching-Yu Chang, Yuansun Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days. days.

(21) Appl. No.: 14/559,723

(22) Filed: Dec. 3, 2014

(65) Prior Publication Data

US 2015/0086924 A1 Mar. 26, 2015

Related U.S. Application Data

(63) Continuation of application No. 13/829,301, filed on Mar. 14, 2013, now Pat. No. 8,932,799.

(60) Provisional application No. 61/777,820, filed on Mar. 12, 2013.

(51) Int. Cl.
```
G03F 7/038      (2006.01)
H01L 21/027     (2006.01)
H01L 21/311     (2006.01)
H01L 21/3213    (2006.01)
H01L 21/308     (2006.01)
```

(52) U.S. Cl.
CPC ............ *G03F 7/038* (2013.01); *G03F 7/0382* (2013.01); *H01L 21/0274* (2013.01); *H01L 21/31144* (2013.01); *H01L 21/32139* (2013.01); *H01L 21/3081* (2013.01)

(58) Field of Classification Search
CPC ............................................ G03F 7/027–7/038
See application file for complete search history.

(56) References Cited

U.S. PATENT DOCUMENTS

| | | |
|---|---|---|
| 4,072,527 A | 2/1978 | Fan |
| 4,212,935 A | 7/1980 | Canavello et al. |
| 4,268,601 A | 5/1981 | Namiki et al. |
| 4,289,845 A | 9/1981 | Bowden et al. |

(Continued)

FOREIGN PATENT DOCUMENTS

| | | |
|---|---|---|
| EP | 1500977 | 1/2005 |
| JP | 2004125835 A | 4/2004 |

(Continued)

OTHER PUBLICATIONS

Machine translation JP 2006-317794. Nov. 24, 2006.*

(Continued)

*Primary Examiner* — Cynthia H Kelly
*Assistant Examiner* — Alyssa L Cepluch
(74) *Attorney, Agent, or Firm* — Slater Matsil, LLP

(57) ABSTRACT

A system and method for photoresists is provided. In an embodiment a cross-linking or coupling reagent is included within a photoresist composition. The cross-linking or coupling reagent will react with the polymer resin within the photoresist composition to cross-link or couple the polymers together, resulting in a polymer with a larger molecular weight. This larger molecular weight will cause the dissolution rate of the photoresist to decrease, leading to a better depth of focus for the line.

19 Claims, 6 Drawing Sheets

(56) References Cited

U.S. PATENT DOCUMENTS

| | | | |
|---|---|---|---|
| 4,346,164 A | 8/1982 | Tabarelli et al. | |
| 4,491,628 A | 1/1985 | Ito et al. | |
| 4,663,275 A | 5/1987 | West et al. | |
| 4,777,119 A | 10/1988 | Brault et al. | |
| 4,939,070 A | 7/1990 | Brunsvold et al. | |
| 5,002,850 A | 3/1991 | Shinozaki et al. | |
| 5,268,260 A | 12/1993 | Bantu et al. | |
| 5,288,588 A | 2/1994 | Yukawa et al. | |
| 5,738,975 A | 4/1998 | Nakano et al. | |
| 5,750,312 A | 5/1998 | Chandross et al. | |
| 5,766,824 A | 6/1998 | Batchelder et al. | |
| 5,856,065 A | 1/1999 | Hagen | |
| 5,863,710 A | 1/1999 | Wakiya et al. | |
| 5,886,102 A | 3/1999 | Sinta et al. | |
| 5,889,141 A | 3/1999 | Marrocco, III et al. | |
| 5,902,599 A | 5/1999 | Anseth et al. | |
| 6,008,265 A | 12/1999 | Vallee et al. | |
| 6,068,962 A * | 5/2000 | Uetani | G03F 7/0226 430/165 |
| 6,147,249 A | 11/2000 | Watanabe et al. | |
| 6,187,504 B1 | 2/2001 | Suwa et al. | |
| 6,306,554 B1 | 10/2001 | Barclay et al. | |
| 6,548,226 B2 | 4/2003 | Lin | |
| 6,627,377 B1 | 9/2003 | Itatani et al. | |
| 6,787,289 B2 | 9/2004 | Yamada et al. | |
| 6,788,477 B2 | 9/2004 | Lin | |
| 6,790,579 B1 | 9/2004 | Goodall et al. | |
| 6,835,527 B2 | 12/2004 | Takata et al. | |
| 6,852,473 B2 | 2/2005 | Roberts et al. | |
| 6,872,503 B2 | 3/2005 | Wheland et al. | |
| 6,875,554 B2 | 4/2005 | Hatanaka et al. | |
| 6,936,400 B2 | 8/2005 | Takasu et al. | |
| 6,952,253 B2 | 10/2005 | Lof et al. | |
| 6,964,840 B2 | 11/2005 | Nishimura et al. | |
| 6,991,888 B2 | 1/2006 | Padmanaban et al. | |
| 7,195,860 B2 | 3/2007 | Endo et al. | |
| 7,235,348 B2 | 6/2007 | Ho et al. | |
| 7,264,918 B2 | 9/2007 | Endo et al. | |
| 7,300,747 B2 | 11/2007 | Okazaki et al. | |
| 7,312,014 B2 | 12/2007 | Maesawa et al. | |
| 7,320,855 B2 | 1/2008 | Huang et al. | |
| 7,344,970 B2 | 3/2008 | Forman et al. | |
| 7,362,412 B2 | 4/2008 | Holmes et al. | |
| 7,393,624 B2 | 7/2008 | Allen et al. | |
| 7,432,035 B2 | 10/2008 | Maeda et al. | |
| 7,432,042 B2 | 10/2008 | Chang et al. | |
| 7,460,206 B2 | 12/2008 | Weissenrieder et al. | |
| 7,470,503 B1 | 12/2008 | Brandl | |
| 7,582,398 B2 | 9/2009 | Iftime et al. | |
| 7,585,612 B2 | 9/2009 | Thackeray et al. | |
| 7,595,141 B2 | 9/2009 | Kudo et al. | |
| 7,608,386 B2 | 10/2009 | Nozaki et al. | |
| 7,648,815 B2 | 1/2010 | Itatani et al. | |
| 7,718,541 B2 | 5/2010 | Makiyama et al. | |
| 7,733,459 B2 | 6/2010 | Dierichs et al. | |
| 7,738,074 B2 | 6/2010 | Streefkerk et al. | |
| 7,779,781 B2 | 8/2010 | Mertens et al. | |
| 7,824,837 B2 | 11/2010 | Wu et al. | |
| 7,846,637 B2 | 12/2010 | Ishizuka et al. | |
| 7,879,529 B2 | 2/2011 | Endo et al. | |
| 7,919,222 B2 | 4/2011 | Vohra et al. | |
| 7,959,141 B2 | 6/2011 | Makino | |
| 7,985,534 B2 | 7/2011 | Tsubaki | |
| 7,989,578 B2 | 8/2011 | Wu | |
| 7,998,655 B2 | 8/2011 | Tsubaki | |
| 8,017,304 B2 | 9/2011 | Tarutani et al. | |
| 8,071,272 B2 | 12/2011 | Tsubaki | |
| 8,088,548 B2 | 1/2012 | Houlihan et al. | |
| 8,088,557 B2 | 1/2012 | Tsubaki | |
| 8,105,748 B2 | 1/2012 | Ohashi et al. | |
| 8,211,615 B2 | 7/2012 | Yamagishi et al. | |
| 8,257,901 B2 | 9/2012 | Kim et al. | |
| 8,323,870 B2 | 12/2012 | Lee et al. | |
| 8,329,387 B2 | 12/2012 | Yao et al. | |
| 8,334,338 B2 | 12/2012 | Yoshimura et al. | |
| 8,460,856 B2 | 6/2013 | Yeh et al. | |
| 8,507,177 B2 | 8/2013 | Wang et al. | |
| 8,518,628 B2 | 8/2013 | Chang et al. | |
| 8,586,290 B2 | 11/2013 | Wang et al. | |
| 8,741,551 B2 | 6/2014 | Wu et al. | |
| 9,581,908 B2 | 2/2017 | Wu et al. | |
| 2001/0044070 A1 | 11/2001 | Uetani et al. | |
| 2002/0015826 A1 | 2/2002 | Desmarteau et al. | |
| 2002/0051933 A1 | 5/2002 | Kodama et al. | |
| 2002/0068237 A1 | 6/2002 | Imai | |
| 2002/0155383 A1* | 10/2002 | Fujimori | G03F 7/0045 430/282.1 |
| 2003/0022097 A1 | 1/2003 | Malik et al. | |
| 2003/0073027 A1 | 4/2003 | Namiki et al. | |
| 2003/0079764 A1 | 5/2003 | Hirose et al. | |
| 2003/0087179 A1 | 5/2003 | Iwasaki | |
| 2003/0175624 A1 | 9/2003 | Nozaki et al. | |
| 2003/0215748 A1 | 11/2003 | Thackeray et al. | |
| 2003/0224287 A1* | 12/2003 | Fujimori | G03F 7/0045 430/270.1 |
| 2003/0235781 A1 | 12/2003 | Shida et al. | |
| 2004/0084150 A1 | 5/2004 | George et al. | |
| 2004/0096780 A1 | 5/2004 | Nozaki et al. | |
| 2004/0161698 A1 | 8/2004 | Kanagasabapathy et al. | |
| 2004/0180299 A1 | 9/2004 | Rolland et al. | |
| 2005/0134817 A1 | 6/2005 | Nakamura | |
| 2005/0145803 A1 | 7/2005 | Hakey et al. | |
| 2005/0145821 A1 | 7/2005 | French et al. | |
| 2005/0225737 A1 | 10/2005 | Weissenrieder et al. | |
| 2005/0266354 A1 | 12/2005 | Li et al. | |
| 2005/0287466 A1 | 12/2005 | Miyamoto et al. | |
| 2006/0008736 A1 | 1/2006 | Kanda et al. | |
| 2006/0105267 A1 | 5/2006 | Khojasteh et al. | |
| 2006/0141400 A1 | 6/2006 | Hirayama et al. | |
| 2006/0204890 A1 | 9/2006 | Kodama | |
| 2006/0246373 A1 | 11/2006 | Wang | |
| 2006/0257781 A1 | 11/2006 | Benoit et al. | |
| 2006/0257785 A1 | 11/2006 | Johnson | |
| 2007/0031755 A1 | 2/2007 | Hirayama et al. | |
| 2007/0207406 A1 | 9/2007 | Guerrero et al. | |
| 2008/0020289 A1 | 1/2008 | Hatakeyama et al. | |
| 2008/0113300 A2 | 5/2008 | Choi et al. | |
| 2008/0149135 A1 | 6/2008 | Cho et al. | |
| 2008/0160729 A1 | 7/2008 | Krueger et al. | |
| 2008/0187860 A1 | 8/2008 | Tsubaki et al. | |
| 2008/0241778 A1 | 10/2008 | Kulp | |
| 2008/0248331 A1 | 10/2008 | Gallagher et al. | |
| 2008/0261150 A1 | 10/2008 | Tsubaki et al. | |
| 2009/0042147 A1 | 2/2009 | Tsubaki | |
| 2009/0305163 A1 | 12/2009 | Iwashita et al. | |
| 2009/0311624 A1 | 12/2009 | Horiguchi et al. | |
| 2010/0040971 A1 | 2/2010 | Tarutani et al. | |
| 2010/0068650 A1 | 3/2010 | Nishimura et al. | |
| 2010/0086870 A1* | 4/2010 | Ogihara | C08G 77/14 430/270.1 |
| 2010/0239984 A1 | 9/2010 | Tsubaki | |
| 2010/0304295 A1 | 12/2010 | Kinsho et al. | |
| 2010/0304302 A1 | 12/2010 | Masunaga et al. | |
| 2011/0020755 A1 | 1/2011 | Tsubaki | |
| 2011/0065878 A1 | 3/2011 | Rhodes et al. | |
| 2011/0097670 A1 | 4/2011 | Wang et al. | |
| 2011/0250543 A1 | 10/2011 | Tsubaki | |
| 2011/0263136 A1 | 10/2011 | Kim et al. | |
| 2012/0052687 A1 | 3/2012 | Raghavan et al. | |
| 2012/0064725 A1 | 3/2012 | Kinsho et al. | |
| 2012/0171616 A1 | 7/2012 | Thackeray et al. | |
| 2012/0202158 A1 | 8/2012 | Hatakeyama et al. | |
| 2012/0238106 A1 | 9/2012 | Chuang | |
| 2012/0282553 A1 | 11/2012 | Kimura et al. | |
| 2012/0308741 A1 | 12/2012 | Kim et al. | |
| 2012/0308939 A1 | 12/2012 | Kudo et al. | |
| 2013/0045365 A1 | 2/2013 | Kato et al. | |
| 2013/0288180 A1 | 10/2013 | Hatakeyama et al. | |
| 2014/0011133 A1 | 1/2014 | Liu et al. | |
| 2014/0042090 A1 | 2/2014 | Bell et al. | |

(56) References Cited

U.S. PATENT DOCUMENTS

2014/0045117 A1 2/2014 Yamaguchi et al.
2014/0170563 A1 6/2014 Hatakeyama

FOREIGN PATENT DOCUMENTS

| JP | 2004170871 | A | | 6/2004 |
|---|---|---|---|---|
| JP | 2006145788 | | | 6/2006 |
| JP | 2006178172 | A | | 7/2006 |
| JP | 2006317794 | A | * | 11/2006 |
| TW | 536661 | B | | 6/2003 |
| TW | 200831546 | A | | 8/2008 |
| TW | I336819 | | | 2/2011 |
| TW | I341961 | | | 5/2011 |
| TW | I1343513 | | | 6/2011 |
| WO | 2005088397 | | | 9/2005 |
| WO | 2006054432 | | | 5/2006 |
| WO | 2008140846 | A1 | | 11/2008 |
| WO | WO2012133257 | | | 10/2012 |

OTHER PUBLICATIONS

Lin et al. A Water-Castable, Water-Developable Chemically Amplified Negative-Tone Resist. 1997. Chem. Mater. 9, 1725-1730.*

Hoo, Ng Wah et al., "The Effect of UPW Quality on Photolithography Defect," Proc. SPIE 7520, Lithography Asia 2009, Dec. 14, 2009, 7 pages, vol. 7520, SPIE, Taipei, Taiwan.

Kitano, Junichi et al., "Resist pattern collapse prevention for the sub-90nm node," Microlithography World, pp. May 2004, 18-24, PennWell Publishing Corp.

Kunz, Roderick R., Kunz SPIE Short Course, 21 pages, MIT Lincoln Library, 2002, publisher unknown.

Lau, Aldrich N. K. et al., "New Thermal Cross-Linkers Based on Triazene: Cross-Linking of Fluorinated Polyimides and Aromatic Polymers," Macromolecules, 1992, pp. 7294-7299, vol. 25.

Reiser, Arnost, Photoreactive Polymers: The Science and Technology of Resists, Feb. 1989, 409 pages, Wiley-Interscience, New York.

Robertson, Stewart et al., "Physical Resist Simulation for a Negative Tone Development Process," 2010 International Symposium on Lithography Extension, Oct. 20-22, 2010, 19 pages.

Sekiguchi, Atsushi et al., "Analysis of Deprotection Reaction in Chemically Amplified Resists Using an Fourier Transform Infrared Spectrometer with an Exposure Tool," Japan J. Appl. Phys., Mar. 2000, pp. 1392-1398, vol. 39, Part 1, No. 3A.

Switkes, M. et al., "Extending optics to 50 nm and beyond with immersion lithography," Journal of Vacuum Science & Technology B: Microelectronics and Nanometer Structures, Nov./Dec. 2003, vol. 21, No. 6., pp. 2794-2799.

Tarutani, Shinji et al., "Process parameter influence to negative tone development process for double patterning," Proc. SPIE 7639, Advances in Resist Materials and Processing Technology XXVII, Mar. 29, 2010, 13 pages, vol. 7639.

Tsvetanova, D. et al., "Degradation of 248 nm Deep UV Photoresist by Ion Implantation," Journal of The Electromechanical Society, Jun. 10, 2011, 10 pages, vol. 158, Issue 8, The Electromechanical Society.

* cited by examiner

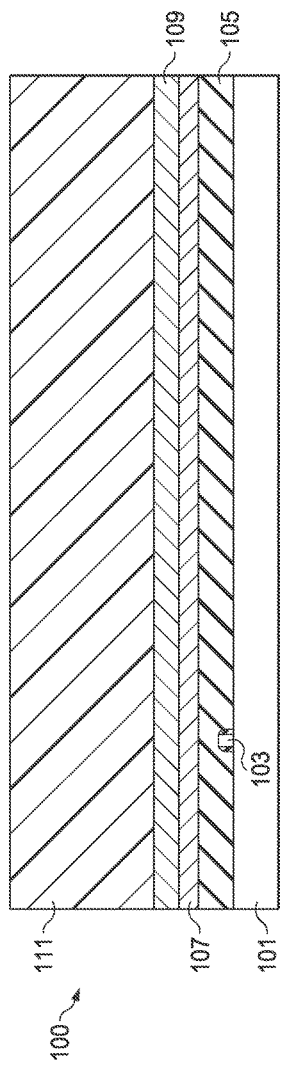
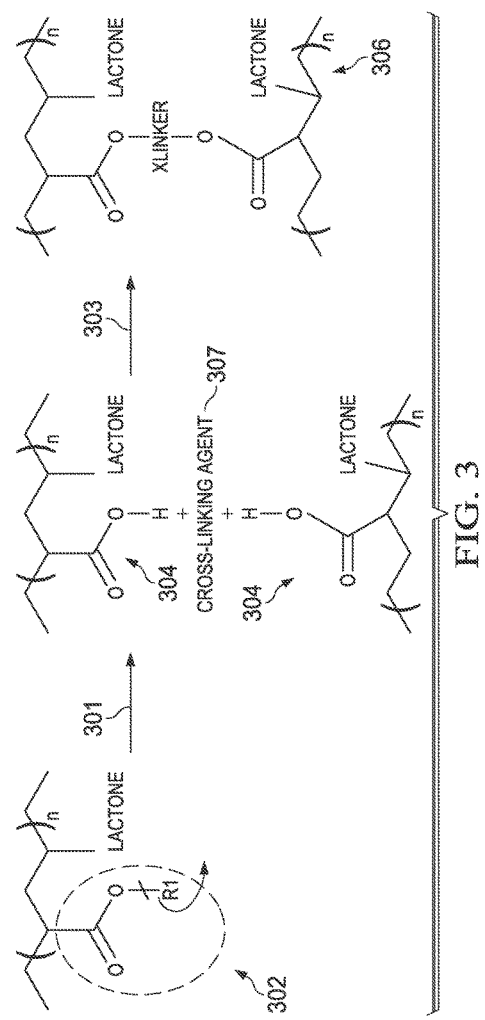

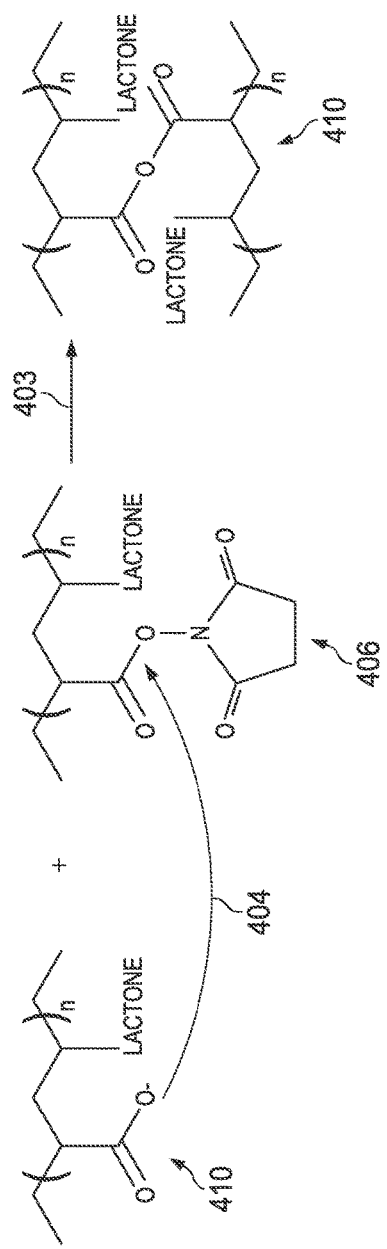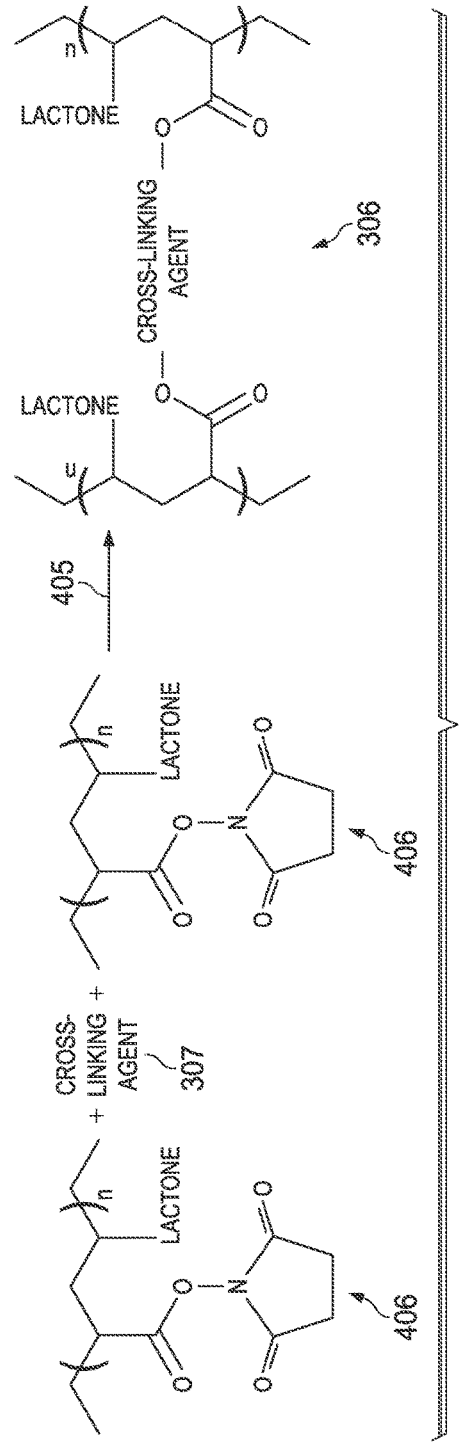
FIG. 4B
FIG. 4C

PHOTORESIST SYSTEM AND METHOD

This application is a continuation of U.S. patent application Ser. No. 13/829,301, filed Mar. 14, 2013 and entitled "Photoresist System and Method," which claims the benefit of U.S. Provisional Application No. 61/777,820, filed on Mar. 12, 2013, entitled "Photoresist System and Method", which applications are hereby incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface and then exposed to an energy that has itself been patterned. Such an exposure modifies the chemical and physical properties of the exposed regions of the photolithographic material. This modification, along with the lack of modification in regions of the photolithographic material that were not exposed, can be exploited to remove one region without removing the other.

However, as the size of individual devices has decreased, process windows for photolithographic processing as become tighter and tighter. As such, advances in the field of photolithographic processing have been necessitated in order to keep up the ability to scale down the devices, and further improvements are needed in order to meet the desired design criteria such that the march towards smaller and smaller components may be maintained.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 1 illustrates a photoresist on a semiconductor substrate with a photoresist in accordance with an embodiment;

FIG. 3 illustrates one possible reaction mechanism in which a cross-linking agent reacts to bond two polymers in accordance with an embodiment;

FIGS. 4A-4C illustrate possible reaction mechanisms of a coupling reagent bonding with a polymer and helping to bond two polymers together in accordance with an embodiment;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 2:
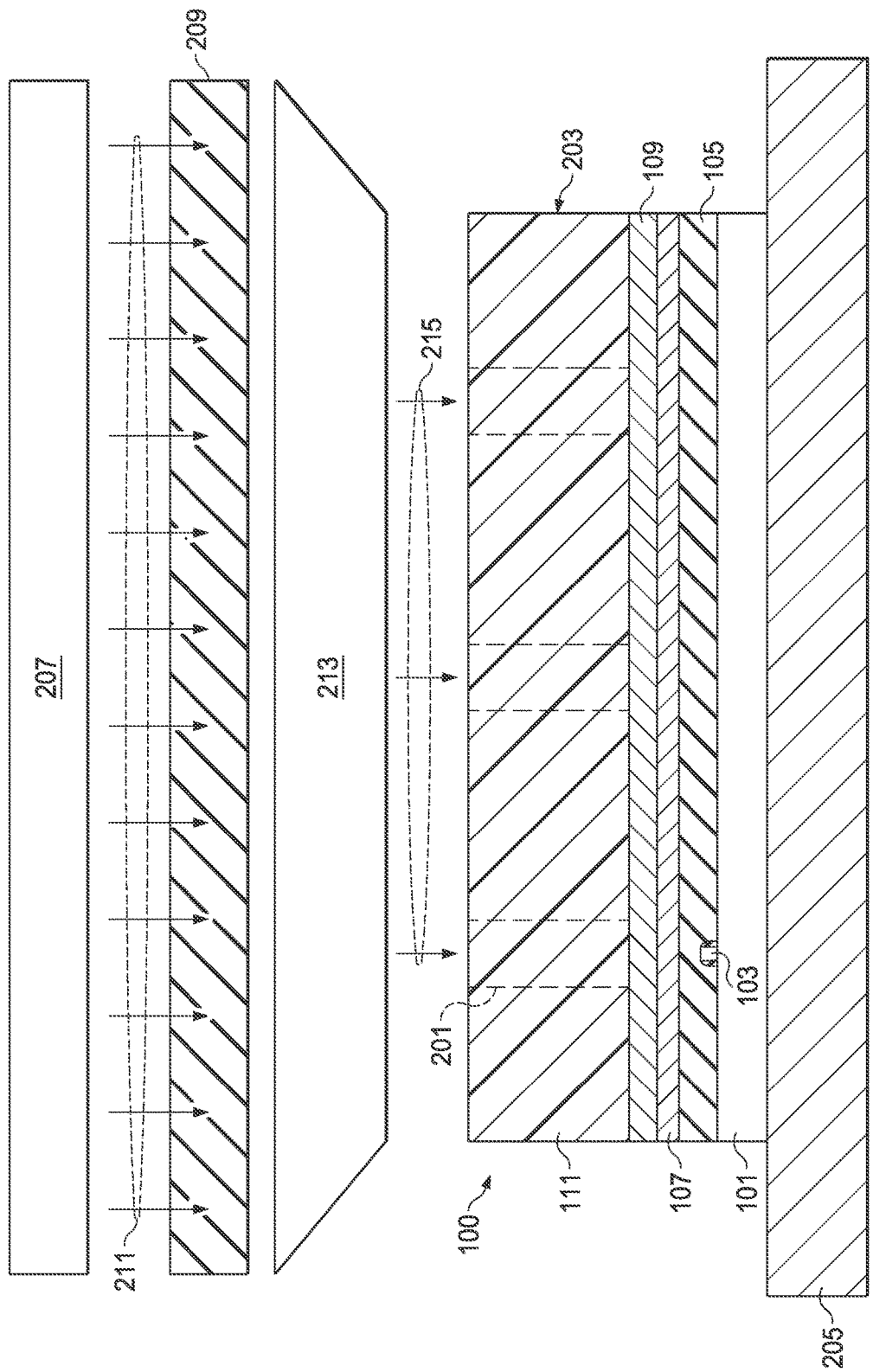
FIG. 2 illustrate an exposure of the photoresist in accordance with an embodiment.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a photoresist process utilized in the manufacturing of semiconductor devices. Other embodiments may also be applied, however, to other masking processes.

With reference now to FIG. 1, there is shown a semiconductor device 100 with a substrate 101, active devices 103 on the substrate 101, an interlayer dielectric (ILD) layer 105 over the active devices 103, metallization layers 107 over the ILD layer 105, a layer to be patterned 109 over the ILD layer 105, and a photoresist 111 over the layer to be patterned 109. The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices 103 are represented in FIG. 1 as a single transistor. However, as one of skill in the art will recognize, a wide variety of active devices such as capacitors, resistors, inductors and the like may be used to generate the desired structural and functional requirements of the design for the semiconductor device 100. The active devices 103 may be formed using any suitable methods either within or else on the surface of the substrate 101.

The ILD layer 105 may comprise a material such as boron phosphorous silicate glass (BPSG), although any suitable dielectrics may be used for either layer. The ILD layer 105 may be formed using a process such as PECVD, although other processes, such as LPCVD, may alternatively be used. The ILD layer 105 may be formed to a thickness of between about 100 Å and about 3,000 Å.

The metallization layers 107 are formed over the substrate 101, the active devices 103, and the ILD layer 105 and are designed to connect the various active devices 103 to form functional circuitry. While illustrated in FIG. 1 as a single layer, the metallization layers 107 are formed of alternating layers of dielectric and conductive material and may be formed through any suitable process (such as deposition, damascene, dual damascene, etc.). In an embodiment there may be four layers of metallization separated from the substrate 101 by the ILD layer 105, but the precise number of metallization layers 107 is dependent upon the design of the semiconductor device 100.

A layer to be patterned 109 or otherwise processed using the photoresist 111 is formed over the metallization layers 107. The layer to be patterned 109 may be an upper layer of the metallization layers 107 or else may be a dielectric layer (such as a passivation layer) formed over the metallization layers 107. In an embodiment in which the layer to be patterned 109 is a metallization layer, the layer to be patterned 109 may be formed of a conductive material using processes similar to the processes used for the metallization layers (e.g., damascene, dual damascene, deposition, etc.). Alternatively, if the layer to be patterned 109 is a dielectric layer the layer to be patterned 109 may be formed of a dielectric material using such processes as deposition, oxidation, or the like.

However, as one of ordinary skill in the art will recognize, while materials, processes, and other details are described in the embodiments, these details are merely intended to be illustrative of embodiments, and are not intended to be limiting in any fashion. Rather, any suitable layer, made of any suitable material, by any suitable process, and any suitable thickness, may alternatively be used. All such layers are fully intended to be included within the scope of the embodiments.

The photoresist 111 is applied to the layer to be patterned 109. In an embodiment the photoresist 111 includes a polymer resin along with one or more photoactive compounds (PACs) in a solvent. In an embodiment the polymer resin may comprise a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In an embodiment the hydrocarbon structure comprises a repeating unit that forms a skeletal backbone of the polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Specific structures which may be utilized for the repeating unit of the hydrocarbon structure include methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl(meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxyl)ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate and the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether and the like. Examples of the styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In an embodiment the repeating unit of the hydrocarbon structure may also have either a monocyclic or a polycyclic hydrocarbon structure substituted into it, or else the monocyclic or polycyclic hydrocarbon structure may be the repeating unit, in order to form an alicyclic hydrocarbon structure. Specific examples of monocyclic structures that may be used include bicycloalkane, tricycloalkane, tetracycloalkane, cyclopentane, cyclohexane, or the like. Specific examples of polycyclic structures that may be used include adamantine, norbornane, isobornane, tricyclodecane, tetracycododecane, or the like.

The group which will decompose, otherwise known as a leaving group or, in an embodiment in which the PAC is a photoacid generator, and acid labile group, is attached to the hydrocarbon structure so that, it will react with the acids/bases/free radicals generated by the PACs during exposure. In an embodiment the group which will decompose may be a carboxylic acid group, a fluorinated alcohol group, a phenolic alcohol group, a sulfonic group, a sulfonamide group, a sulfonylimido group, an (alkylsulfonyl) (alkylcarbonyl)methylene group, an (alkylsulfonyl)(alkyl-carbonyl) imido group, a bis(alkylcarbonyl)methylene group, a bis (alkylcarbonyl)imido group, a bis(alkylsylfonyl)methylene group, a bis(alkylsulfonyl)imido group, a tris(alkylcarbonyl methylene group, a tris(alkylsulfonyl)methylene group, combinations of these, or the like. Specific groups that may be utilized for the fluorinated alcohol group include fluorinated hydroxyalkyl groups, such as a hexafluoroisopropanol group. Specific groups that may be utilized for the carboxylic acid group include acrylic acid groups, methacrylic acid groups, or the like.

In an embodiment the polymer resin may also comprise other groups attached to the hydrocarbon structure that help to improve a variety of properties of the polymerizable resin. For example, inclusion of a lactone group to the hydrocarbon structure assists to reduce the amount of line edge roughness after the photoresist 111 has been developed, thereby helping to reduce the number of defects that occur during development. In an embodiment the lactone groups may include rings having five to seven members, although any suitable lactone structure may alternatively be used for the lactone group.

The polymer resin may also comprise groups that can assist in increasing the adhesiveness of the photoresist 111 to underlying structures (e.g., the layer to be patterned 109). In an embodiment polar groups may be used to help increase the adhesiveness, and polar groups that may be used in this embodiment include hydroxyl groups, cyano groups, or the like, although any suitable polar group may alternatively be utilized.

Optionally, the polymer resin may further comprise one or more alicyclic hydrocarbon structures that do not also contain a group which will decompose. In an embodiment the hydrocarbon structure that does not contain a group which will decompose may includes structures such as 1-adamantyl(meth)acrylate, tricyclodecanyl(meth)acrylate, cyclohexayl(methacrylate), combinations of these, or the like.

Additionally, the photoresist 111 also comprises one or more PACs. The PACs may be photoactive components such as photoacid generators, photobase generators, free-radical generators, or the like, and the PACs may be positive-acting or negative-acting. In an embodiment in which the PACs are a photoacid generator, the PACs may comprise halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photoacid generators that may be used include α-(trifluoromethylsulfonyloxy)-bicyclo[2.2.1] hept-5-ene-2,3-dicarbo-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitrosubstituted benzyl alcohols, naphthoquinone-4-diazides, alkyl disulfones, and the like.

In an embodiment in which the PACs are a free-radical generator, the PACs may comprise n-phenylglycine, aromatic ketones such as benzophenone, N,N-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis (dimethylamino)benzo-phenone, p,p'-bis(diethylamino)-benzophenone, anthraquinone, 2-ethylanthraquinone, naphthaquinone and phenanthraquinone, benzoins such as benzoin, benzoinmethylether, benzoinethylether, benzoinisopropylether, benzoin-n-butylether, benzoin-phenyether, methylbenzoin and ethybenzoin, benzyl derivatives such as dibenzyl, benzyldiphenyldisulfide and benzyldimethylketal, acridine derivatives such as 9-phenylacridine and 1,7-bis(9-acridinyl)heptane, thioxanthones such as 2-chlorothioxanthone, 2-methylthioxanthone, 2,4-diethylthioxanthone, 2,4-dimethylthioxanthone and 2-isopropylthioxanthone, acetophenones such as 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone, 2,4,5-triarylimidazole dimers such as 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer, suitable combinations of these, or the like.

In an embodiment in which the PACs are a photobase generator, the PACs may comprise quaternary ammonium dithiocarbamates, α aminoketones, oxime-urethane containing molecules such as dibenzophenoneoxime hexamethylene diurethan, ammonium tetraorganylborate salts, and N-(2-nitrobenzyloxycarbonyl) cyclic amines, suitable combinations of these, or the like. However, as one of ordinary skill in the art will recognize, the chemical compounds listed herein are merely intended as illustrated examples of the PACs and are not intended to limit the embodiments to only those PACs specifically described. Rather, any suitable PAC may alternatively be utilized, and all such PACs are fully intended to be included within the scope of the present embodiments.

In an embodiment a cross-linking agent 307 (not individually illustrated in FIG. 1 but illustrated and discussed further below with respect to FIG. 3) is also be added to the photoresist 111. The cross-linking agent 307 reacts with one group from one of the hydrocarbon structures in the polymer resin and also reacts with a second group from a separate one of the hydrocarbon structures in order to cross-link and bond the two hydrocarbon structures together. This bonding and cross-linking increases the molecular weight of the polymer products of the cross-linking reaction and increases the overall linking density of the photoresist 111. Such an increase in density and linking density helps to improve the resist pattern and also helps to improve the photoresist's 111 resistance to dry etching once the photoresist 111 has been developed.

In an embodiment, cross-linking agent 307 may have the following structure:

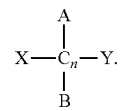

Cross-linking agent 307 may have an n-carbon chain, wherein n can be from between 1 to 15 carbons, the n-carbon chain has substituents A and B comprising at least one of hydrogen, hydroxyl, halide, cyclo-aromatic, alkyl, or a straight or cyclic alkyl, alkoxy/fluoro, alkyl/fluoroalkoxy chain having a number of carbons between 1 and 12, and the n-carbon chain has substituents X and Y comprising at least one of amine, thiol, hydroxyl, isopropyl alcohol, or isopropyl amine.

Specific examples of materials that may be used as cross-linking agent 307 include the following:

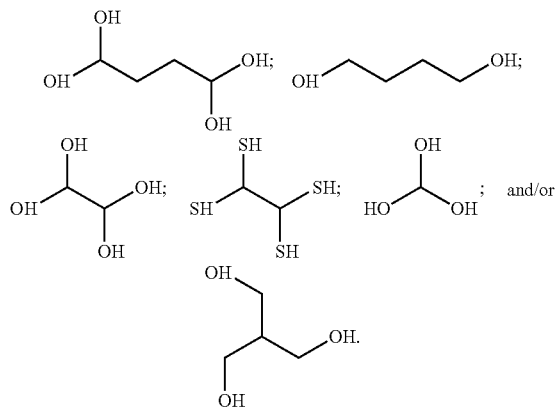

Alternatively, instead of or in addition to the cross-linking agent 307 being added to the photoresist composition, a coupling reagent 408 (not separately illustrated in FIG. 1 but illustrated and discussed further below with respect to FIG. 4A) may also be added. In an embodiment in which the coupling reagent 408 is added in addition to the cross-linking agent 307, the coupling reagent 408 assists the cross-linking reaction by reacting with the groups on the hydrocarbon structure in the polymer resin before the cross-linking reagent, allowing for a reduction in the reaction energy of the cross-linking reaction and an increase in the rate of reaction. The bonded coupling reagent 408 then reacts with the cross-linking agent 307, thereby coupling the cross-linking agent 307 to the polymer resin.

Alternatively, in an embodiment in which the coupling reagent 408 is added to the photoresist 111 without the cross-linking agent 307, the coupling reagent 408 can be used to couple one group from one of the hydrocarbon structures in the polymer resin to a second group from a separate one of the hydrocarbon structures in order to cross-link and bond the two polymers together. However, in such an embodiment the coupling reagent 408, unlike the cross-linking agent 307, does not remain as part of the polymer, and only assists in bonding one hydrocarbon structure directly to another hydrocarbon structure.

In an embodiment the coupling reagent 408 may have the following structure:

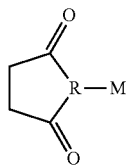

where R is a carbon atom, a nitrogen atom, or a sulfur atom; M comprises a chlorine atom, a bromine atom, an iodine atom, —NO2; —SO3-; —H; —CN; —NCO, —OCN; —CO2-; —OH; epoxyl groups, or the like. Specific examples of materials that may be used as the coupling reagent 408 include the following:

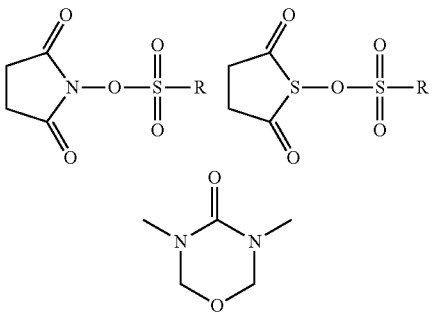

where R is a carbon atom.

The individual components of the photoresist 111 may be placed into a solvent in order to aid in the mixing and placement of the photoresist 111. To aid in the mixing and placement of the photoresist 111, the solvent is chosen at least in part based upon the materials chosen for the polymer resin as well as the PACs. In particular, the solvent is chosen such that the polymer resin and the PACs can be evenly dissolved into the solvent and dispensed upon the layer to be patterned 109.

In an embodiment the solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the solvent for the photoresist 111 include, acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol dimethyl ether, ethylene glycol methylethyl ether, ethylene glycol monoetheryl ether, methyl cellusIve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, dietherylene glycol monoethyl ether, diethylene glycol monbutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, proplyelen glycol methyl ether adcetate, proplylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, methyl lactate, ethyl lactate, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate- 2-methoxyethyl, acetate-2-ethoxyethyl, acetate-2-(2-ethoxyethoxyl)ethyl, acetate-3-methoxy-3-methylbutyl, acetate-1-methoxy-2-propyl, dipropylene glycol, monomethylether, monoethylether, monopropylether, monobutylehter, monopheylether, dipropylene glycol monoacetate, dioxane, methyl lactate, etheyl lactate, methyl acetate, ethyl acetate, butyl acetate, methyl puruvate, ethyl puruvate, propyl pyruvate, methyl methoxypropionate, ethyl ethoxypropionate, n-methylpyrrolidone (NMP), 2-methoxyethyl ether (diglyme), ethylene glycol monom-ethyl ether, propylene glycol monomethyl ether; ethyl lactate or methyl lactate, methyl proponiate, ethyl proponiate and ethyl ethoxy proponiate, methylethyl ketone, cyclohexanone, 2-heptanone, carbon dioxide, cyclopentatone, cyclohexanone, ethyl 3-ethocypropionate, ethyl lactate, propylene glycol methyl ether acetate (PGMEA), methylene cellosolve, butyle acetate, and 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, or the like.

However, as one of ordinary skill in the art will recognize, the materials listed and described above as examples of materials that may be utilized for the solvent component of the photoresist 111 are merely illustrative and are not intended to limit the embodiments. Rather, any suitable material that may dissolve the polymer resin and the PACs may alternatively be utilized to help mix and apply the photoresist 111. All such materials are fully intended to be included within the scope of the embodiments.

Additionally, while individual ones of the above described materials may be used as the solvent for the photoresist 111, in alternative embodiments more than one of the above described materials may be utilized. For example, the solvent may comprise a combination mixture of two or more of the materials described. All such combinations are fully intended to included within the scope of the embodiments.

In addition to the polymer resins, the PACs, the solvents, the cross-linking agent 307, and the coupling reagent 408, the photoresist 111 may also include a number of other additives that will assist the photoresist 111 obtain the highest resolution. For example, the photoresist 111 may also include surfactants in order to help improve the ability of the photoresist 111 to coat the surface on which it is applied. In an embodiment the surfactants may include nonionic surfactants, polymers having fluorinated aliphatic groups, surfactants that contain at least one fluorine atom and/or at least one silicon atom, polyoxyethylene alkyl ethers, polyoxyethylene alkyl aryl ethers, polyoxyethylene-polyoxypropylene block copolymers, sorbitan fatty acid esters, polyoxyethylene sorbitan fatty acid esters.

Specific examples of materials that may be used as surfactants include polyoxyethylene lauryl ether, polyoxyethylene stearyl ether, polyoxyethylene cetyl ether, polyoxyethylene oleyl ether, polyoxyethylene octyl phenol ether, polyoxyethylene nonyl phenol ether, sorbitan monolaurate, sorbitan monopalmitate, sorbitan monostearate, sorbitan monooleate, sorbitan trioleate, sorbitan tristearate, polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, polyethylene glycol distearate, polyethylene glycol dilaurate, polyethylene glycol dilaurate, polyethylene glycol, polypropylene glycol, polyoxyethylenestearyl ether and polyoxyethylene cetyl ether; fluorine containing cationic surfactants, fluorine containing nonionic surfactants, fluorine containing anionic surfactants, cationic surfactants and anionic surfactants, polyethylene glycol, polypropylene glycol, polyoxyethylene cetyl ether, combinations of these, or the like.

Another additive that may be added to the photoresist 111 is a quencher, which may be utilized to inhibit diffusion of the generated acids/bases/free radicals within the photoresist, which helps the resist pattern configuration as well as to improve the stability of the photoresist 111 over time. In an embodiment the quencher is an amine such as a second lower aliphatic amine, a tertiary lower aliphatic amine, or the like. Specific examples of amines that may be used include trimethylamine, diethylamine, triethylamine, di-n-propylamine, tri-n-propylamine, tripentylamine, diethanolamine, and triethanolamine, alkanolamine, combinations of these, or the like.

Alternatively, an organic acid may be utilized as the quencher. Specific embodiments of organic acids that may be utilized include malonic acid, citric acid, malic acid, succinic acid, benzoic acid, salicylic acid, phosphorous oxo acid and its derivatives such as phosphoric acid and derivatives thereof such as its esters, such as phosphoric acid, phosphoric acid di-n-butyl ester and phosphoric acid diphenyl ester; phosphonic acid and derivatives thereof such as its ester, such as phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as its esters, including phosphinic acid and phenylphosphinic acid.

Another additive that may be added to the photoresist 111 is a stabilizer, which assists in preventing undesired diffusion of the acids generated during exposure of the photoresist 111. In an embodiment the stabilizer may include nitrogenous compounds such as aliphatic primary, secondary, and tertiary amines, cyclic amines such as piperidines, pyrrolidines, morpholines, aromatic heterocycles such as pyridines, pyrimidines, purines, imines such as diazabicycloundecene, guanidines, imides, amides, and others. Alternatively, ammonium salts may also be used for the stabilizer, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed.

Yet another additive that may be added to the photoresist 111 may be a dissolution inhibitor in order to help control dissolution of the photoresist 111 during development. In an embodiment bile-salt esters may be utilized as the dissolution inhibitor. Specific examples of materials that may be utilized include cholic acid (IV), deoxycholic acid (V), lithocholic acid (VI), t-butyl deoxycholate (VII), t-butyl lithocholate (VIII), and t-butyl-3-α-acetyl lithocholate (IX).

Another additive that may be added to the photoresist 111 may be a plasticizer. Plasticizers may be used to reduce delamination and cracking between the photoresist 111 and underlying layers (e.g., the layer to be patterned 109) and may comprise monomeric, loigomeric, and polymeric plasticizers such as oligo-anpolyethyleneglycol ethers, cycloaliphatic esters, and non-acid reactive steroidally-derived materials. Specific examples of materials that may be used for the plasticizer include dioctyl phthalate, didodecyl phthalate, triethylene glycol dicaprylate, dimethyl glycol phthalate, tricresyl phosphate, dioctyl adipate, dibutyl sebacate, triacetyl glycerine and the like.

Yet another additive that may be added include a coloring agent, which helps observers examine the photoresist 111 and find any defects that may need to be remedied prior to further processing. In an embodiment the coloring agent may be either a triarylmethane dye or, alternatively, may be a fine particle organic pigment. Specific examples of materials that may be used as coloring agents include crystal violet, methyl violet, ethyl violet, oil blue #603, Victoria Pure Blue BOH, malachite green, diamond green, phthalocyanine pigments, azo pigments, carbon black, titanium oxide, brilliant green dye (C. I. 42020), Victoria Pure Blue FGA (Linebrow), Victoria BO (Linebrow) (C. I. 42595), Victoria Blue BO (C. I. 44045) rhodamine 6G (C. I. 45160), Benzophenone compounds such as 2,4-dihydroxybenzophenone and 2,2',4,4'-tetrahydroxybenzophenone, salicylic acid compounds such as phenyl salicylate and 4-t-butylphenyl salicylate, phenylacrylate compounds such as ethyl-2-cyano-3,3-diphenylacrylate, and 2'-ethylhexyl-2-cyano-3,3-diphenylacrylate, benzotriazole compounds such as 2-(2-hydroxy-5-methylphenyl)-2H-benzotriazole, and 2-(3-t-butyl-2-hydroxy-5-methylphenyl)-5-chloro-2H-benzotriazole, coumarin compounds such as 4-methyl-7-diethylamino-1-benzopyran-2-one, thioxanthone compounds such as diethylthioxanthone, stilbene compounds, naphthalic acid compounds, azo dyes, Phthalocyanine blue, phthalocyanine green, iodine green, Victoria blue, crystal violet, titanium oxide, carbon black, naphthalene black, Photopia methyl violet, bromphenol blue and bromcresol green, laser dyes such as Rhodamine G6, Coumarin 500, DCM (4-(dicyanomethylene)-2-methyl-6-(4-dimethylaminostyryl)-4H pyran)), Kiton Red 620, Pyrromethene 580, or the like. Additionally, one or more coloring agents may be used in combination to provide the desired coloring.

Adhesion additives may also be added to the photoresist 111 in order to promote adhesion between the photoresist 111 and an underlying layer upon which the photoresist 111 has been applied (e.g., the layer to be patterned 109). In an embodiment the adhesion additives include a silane compound with at least one reactive substituent such as a carboxyl group, a methacryloyl group, an isocyanate group and/or an epoxy group. Specific examples of the adhesion components include trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane, benzimidazoles and polybenzimidazoles, a lower hydroxyalkyl substituted pyridine derivative, a nitrogen heterocyclic compound, urea, thiourea, an organophosphorus compound, 8-oxyquinoline, 4-hydroxypteridine and derivatives, 1,10-phenanthroline and derivatives, 2,2'-bipyridine and derivatives, benzotriazoles; organophosphorus compounds, phenylenediamine compounds, 2-amino-1-phenylethanol, N-phenylethanolamine, N-ethyldiethanolamine, N-ethylethanolamine and derivatives, benzothiazole, and a benzothiazoleamine salt having a cyclohexyl ring and a morpholine ring, 3-glycidoxypropyltrimethoxysilane, 3-glycidoxypropyltriethoxysilane, 3-mercaptopropyltrimethoxysilane, 3-mercaptopropyltriethoxysilane, 3-methacryloyloxypropyltrimethoxysilane, vinyl trimethoxysilane, combinations of these, or the like.

Surface leveling agents may additionally be added to the photoresist 111 in order to assist a top surface of the photoresist 111 to be level so that impinging light will not be adversely modified by an unlevel surface. In an embodiment surface leveling agents may include fluoroaliphatic esters, hydroxyl terminated fluorinated polyethers, fluorinated ethylene glycol polymers, silicones, acrylic polymer leveling agents, combinations of these, or the like.

In an embodiment the polymer resin and the PACs, along with any desired additives or other agents, are added to the solvent for application. Once added, the mixture is then mixed in order to achieve an even composition throughout the photoresist 111 in order to ensure that there are no defects caused by an uneven mixing or non-constant composition of the photoresist 111. Once mixed together, the photoresist 111 may either be stored prior to its usage or else used immediately.

Once ready, the photoresist 111 may be utilized by initially applying the photoresist 111 onto the layer to be patterned 109. The photoresist 111 may be applied to the layer to be patterned 109 so that the photoresist 111 coats an upper exposed surface of the layer to be patterned 109, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the photoresist 111 may be applied such that it has a thickness over the surface of the layer to be patterned 109 of between about 10 nm and about 300 nm, such as about 150 nm.

Once the photoresist 111 has been applied to the semiconductor substrate, a pre-bake of the photoresist 111 is performed in order to cure and dry the photoresist 111 prior to exposure to finish the application of the photoresist 111. The curing and drying of the photoresist 111 removes the solvent component while leaving behind the polymer resin, the PACs, the cross-linking agent 307, and the other chosen additives. In an embodiment the pre-bake may be performed at a temperature suitable to evaporate the solvent, such as between about 50° C. and 250° C., although the precise temperature depends upon the materials chosen for the photoresist 111. The pre-bake is performed for a time sufficient to cure and dry the photoresist 111, such as between about 10 seconds to about 5 minutes, such as about 90 seconds.

FIG. 2 illustrates an exposure of the photoresist 111 to form an exposed region 201 and an unexposed region 203 within the photoresist 111. In an embodiment the exposure may be initiated by placing the semiconductor device 100 and the photoresist 111, once cured and dried, into an imaging device for exposure. The imaging device may comprise a support plate 205, an energy source 207, a patterned mask 209 between the support plate 205 and the energy source 207, and optics 213. In an embodiment the support plate 205 is a surface to which the semiconductor device 100 and the photoresist 111 may be placed or attached to and which provides support and control to the substrate 101 during exposure of the photoresist 111. Additionally, the support plate 205 may be movable along one or more axes, as well as providing any desired heating or cooling to the substrate 101 and photoresist 111 in order to prevent temperature gradients from affecting the exposure process.

In an embodiment the energy source 207 supplies energy 211 such as light to the photoresist 111 in order to induce a reaction of the PACs, which in turn reacts with the polymer resin to chemically alter those portions of the photoresist 111 to which the energy 211 impinges. In an embodiment the energy 211 may be electromagnetic radiation, such as g-rays (with a wavelength of about 436 nm), i-rays (with a wavelength of about 365 nm), ultraviolet radiation, far ultraviolet radiation, x-rays, electron beams, or the like. The energy source 207 may be a source of the electromagnetic radiation, and may be a KrF excimer laser light (with a wavelength of 248 nm), an ArF excimer laser light (with a wavelength of 193 nm), a $F_2$ excimer laser light (with a wavelength of 157 nm), or the like, although any other suitable source of energy 211, such as mercury vapor lamps, xenon lamps, carbon arc lamps or the like, may alternatively be utilized.

The patterned mask 209 is located between the energy source 207 and the photoresist 111 in order to block portions of the energy 211 to form a patterned energy 215 prior to the energy 211 actually impinging upon the photoresist 111. In an embodiment the patterned mask 209 may comprise a series of layers (e.g., substrate, absorbance layers, anti-reflective coating layers, shielding layers, etc.) to reflect, absorb, or otherwise block portions of the energy 211 from reaching those portions of the photoresist 111 which are not desired to be illuminated. The desired pattern may be formed in the patterned mask 209 by forming openings through the patterned mask 209 in the desired shape of illumination.

Optics (represented in FIG. 2 by the trapezoid labeled 213) may be used to concentrate, expand, reflect, or otherwise control the energy 211 as it leaves the energy source 207, is patterned by the patterned mask 209, and is directed towards the photoresist 111. In an embodiment the optics 213 comprise one or more lenses, mirrors, filters, combinations of these, or the like to control the energy 211 along its path. Additionally, while the optics 213 are illustrated in FIG. 2 as being between the patterned mask 209 and the photoresist 111, elements of the optics 213 (e.g., individual lenses, mirrors, etc.) may also be located at any location between the energy source 207 (where the energy 211 is generated) and the photoresist 111.

In an embodiment the semiconductor device 100 with the photoresist 111 is placed on the support plate 205. Once the pattern has been aligned to the semiconductor device 100, the energy source 207 generates the desired energy 211 (e.g., light) which passes through the patterned mask 209 and the optics 213 on its way to the photoresist 111. The patterned energy 215 impinging upon portions of the photoresist 111 induces a reaction of the PACs within the photoresist 111. The chemical reaction products of the PACs' absorption of the patterned energy 215 (e.g., acids/bases/free radicals) then reacts with the polymer resin, chemically altering the photoresist 111 in those portions that were illuminated through the patterned mask 209.

In a specific example in which the patterned energy 215 is a 193 nm wavelength of light, the PAC is a photoacid generator, and the group to be decomposed is a carboxylic acid group on the hydrocarbon structure and a cross linking agent is used, the patterned energy 215 will impinge upon the photoacid generator and the photoacid generator will absorb the impinging patterned energy 215. This absorption initiates the photoacid generator to generate a proton (e.g., a $H^+$ atom) within the photoresist 111. When the proton impacts the carboxylic acid group on the hydrocarbon structure, the proton will react with the carboxylic acid group, chemically altering the carboxylic acid group and altering the properties of the polymer resin in general. The carboxylic acid group will then react with the cross-linking agent 307 to cross-link with other polymer resins within the photoresist 111.

Optionally, the exposure of the photoresist 111 may occur using an immersion lithography technique. In such a technique an immersion medium (not individually illustrated in FIG. 2) may be placed between the imaging device 200 (and particularly between a final lens of the optics 213) and the photoresist 111. With this immersion medium in place, the photoresist 111 may be patterned with the patterned energy 215 passing through the immersion medium.

In this embodiment a protective layer (also not individually illustrated in FIG. 2) may be formed over the photoresist 111 in order to prevent the immersion medium from coming into direct contact with the photoresist 111 and leaching or otherwise adversely affecting the photoresist 111. In an embodiment the protective layer is insoluble within the immersion medium such that the immersion medium will not dissolve it and is immiscible in the photoresist 111 such that the protective layer will not adversely affect the photoresist 111. Additionally, the protective layer is transparent so that the patterned energy 215 may pass through the protective layer.

In an embodiment the protective layer comprises a protective layer resin within a protective layer solvent. The material used for the protective layer solvent is, at least in part, dependent upon the components chosen for the photoresist 111, as the protective layer solvent should not dissolve the materials of the photoresist 111 so as to avoid degradation of the photoresist 111 during application and use of the protective layer. In an embodiment the protective layer solvent includes alcohol solvents, fluorinated solvents, and hydrocarbon solvents.

Specific examples of materials that may be utilized for the protective layer solvent include methanol, ethanol, 1-propanol, isopropanol, n-propanol, 1-butanol, 2-butanol, 2-methyl-2-propanol, 3-methyl-1-butanol, isobutyl alcohol, tert-butyl alcohol, 1-pentanol, 2-pentanol, 3-pentanol, n-hexanol, cyclohecanol, 1-hexanol, 1-heptanol, 1-octanol, 2-hexanol, 2-heptanol, 2-octanol, 3-hexanol, 3-heptanol, 3-octanol, 4-octanol, 2-methyl-2-butanol, 3-methyl-1-butanol, 3-methyl-2-butanol, 2-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,2,3,3,4,4-hexafluoro-1-butanol, 2,2,3,3,4,4,5,5-octafluoro-1-pentanol, 2,2,3,3,4,4,5,5,6,6-decafluoro-1-hexanol, 2,2,3,3,4,4-hexafluoro-1,5-pentanediol, 2,2,3,3,4,4,5,5-octafluoro-1,6-hexanediol, 2,2,3,3,4,4,5,5,6,6,7,7-dodecafluoro-1,8-diol, 2-fluoroanisole, 2,3-difluoroanisole, perfluorohexane, perfluoroheptane, perfluoro-2-pentanone, perfluoro-2-butyltetrahydrofuran, perfluorotetrahydrofuran, perfluorotributylamine, perfluorotetrapentylamine, toluene, xylene and anisole, and aliphatic hydrocarbon solvents, such as n-heptane, n-nonane, n-octane, n-decane, 2-methylheptane, 3-methylheptane, 3,3-dimethylhexane, 2,3,4-trimethylpentane, combinations of these, or the like.

The protective layer resin may comprise a protective layer repeating unit. In an embodiment the protective layer repeating unit may be an acrylic resin with a repeating hydrocarbon structure having a carboxyl group, an alicyclic structure, an alkyl group having one to five carbon atoms, a phenol group, or a fluorine atom-containing group. Specific examples of the alicyclic structure include a cyclohexyl group, an adamantyl group, a norbornyl group, a isobornyl group, a tricyclodecyl group, a tetracyclododecyl group, and the like. Specific examples of the alkyl group include an n-butyl group, an isobutyl group, or the like. However, any suitable protective layer resin may alternatively be utilized.

The protective layer composition may also include additional additives to assist in such things as adhesion, surface leveling, coating, and the like. For example, the protective layer composition may further comprise a protective layer surfactant, although other additives may also be added, and all such additions are fully intended to be included within the scope of the embodiment. In an embodiment the protective layer surfactant may be an alkyl cationic surfactant, an amide-type quaternary cationic surfactant, an ester-type quaternary cationic surfactant, an amine oxide surfactant, a betaine surfactant, an alkoxylate surfactant, a fatty acid ester surfactant, an amide surfactant, an alcohol surfactant, an ethylenediamine surfactant, or a fluorine- and/or silicon-containing surfactant.

Specific examples of materials that may be used for the protective layer surfactant include polyoxyethylene alkyl ethers, such as polyoxyethylene lauryl ether, polyoxyethylene stearyl ether, polyoxyethylene cetyl ether and polyoxyethylene oleyl ether; polyoxyethylene alkyl aryl ethers, such as polyoxyethylene octyl phenol ether and polyoxyethylene nonyl phenol ether; polyoxyethylene-polyooxypropylene block copolymers; sorbitan fatty acid esters, such as sorbitan monolaurate, sorbitan monopalmitate, sorbitan monostearate, sorbitan monooleate, sorbitan trioleate and sorbitan tristearate; and polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate.

Prior to application of the protective layer onto the photoresist 111, the protective layer resin and desired additives are first added to the protective layer solvent to form a protective layer composition. The protective layer solvent is then mixed to ensure that the protective layer composition has a consistent concentration throughout the protective layer composition.

Once the protective layer composition is ready for application, the protective layer composition may be applied over the photoresist 111. In an embodiment the application may be performed using a process such as a spin-on coating process, a dip coating method, an air-knife coating method, a curtain coating method, a wire-bar coating method, a gravure coating method, a lamination method, an extrusion coating method, combinations of these, or the like. In an embodiment the photoresist 111 may be applied such that it has a thickness over the surface of the photoresist 111 of about 100 nm.

After the protective layer composition has been applied to the photoresist 111, a protective layer pre-bake may be performed in order to remove the protective layer solvent. In an embodiment the protective layer pre-bake may be performed at a temperature suitable to evaporate the protective layer solvent, such as between about 40° C. and 150° C., although the precise temperature depends upon the materials chosen for the protective layer composition. The protective layer pre-bake is performed for a time sufficient to cure and dry the protective layer composition, such as between about 10 seconds to about 5 minutes, such as about 90 seconds.

Once the protective layer has been placed over the photoresist 111, the semiconductor device 100 with the photoresist 111 and the protective layer are placed on the support plate 205, and the immersion medium may be placed between the protective layer and the optics 213. In an embodiment the immersion medium is a liquid having a refractive index greater than that of the surrounding atmosphere, such as having a refractive index greater than 1. Examples of the immersion medium may include water, oil, glycerine, glycerol, cycloalkanols, or the like, although any suitable medium may alternatively be utilized.

The placement of the immersion medium between the protective layer and the optics 213 may be done using, e.g., an air knife method, whereby fresh immersion medium is applied to a region between the protective layer and the optics 213 and controlled using pressurized gas directed towards the protective layer to form a barrier and keep the immersion medium from spreading. In this embodiment the immersion medium may be applied, used, and removed from the protective layer for recycling so that there is fresh immersion medium used for the actual imaging process.

However, the air knife method described above is not the only method by which the photoresist 111 may be exposed using an immersion method. Any other suitable method for imaging the photoresist 111 using an immersion medium, such as immersing the entire substrate 101 along with the photoresist 111 and the protective layer, using solid barriers instead of gaseous barriers, or using an immersion medium without a protective layer, may also be utilized. Any suitable method for exposing the photoresist 111 through the immersion medium may be used, and all such methods are fully intended to be included within the scope of the embodiments.

After the photoresist 111 has been exposed to the patterned energy 215, a post-exposure baking may be used in order to assist in the generating, dispersing, and reacting of the acid/base/free radical generated from the impingement of the patterned energy 215 upon the PACs during the exposure. Such assistance helps to create or enhance chemical reactions which generate chemical differences between the exposed region 201 and the unexposed region 203 within the photoresist 111. These chemical differences also caused differences in the solubility between the exposed region 201 and the unexposed region 203. In an embodiment this post-exposure baking may occur at temperatures of between about 50° C. and about 160° C. for a period of between about 40 seconds and about 120 seconds.

Additionally, the inclusion of the cross-linking agent 307 into the chemical reactions helps the components of the polymer resin (e.g., the individual polymers) react and bond with each other, increasing the molecular weight of the bonded polymer. FIG. 3 illustrates one possible reaction mechanism that may occur during the exposure and post-exposure baking in which the cross-linking agent 307 is utilized by itself (e.g., without the coupling reagent 408) to bond to two polymers within the polymer resin, thereby bonding the two polymers to each other. In particular, FIG. 3 illustrates an initial polymer 302 comprising a side chain with a carboxylic acid protected by one of the groups to be removed/acid labile groups (illustrated as R1 in FIG. 3). The groups to be removed R1 are removed in a de-protecting reaction 301, which is initiated by a proton $H^+$ generated by, e.g., the photoacid generator during either the exposure process or else during the post-exposure baking process. This proton $H^+$ first removes the groups to be removed/acid labile groups R1 and another hydrogen atom may replace the removed structure to form a de-protected polymer 304.

Once de-protected, a cross-linking reaction 303 will occur between two separate ones of the de-protected polymers 304 that have undergone the de-protecting reaction 301 react with the cross-linking agent 307 in a cross-linking reaction 303. In particular, hydrogen atoms within the carboxylic groups formed by the de-protecting reaction 301 will be removed and the oxygen atoms will react with and bond with the cross-linking agent 307. This bonding of the cross-linking agent 307 to two polymers bonds the two polymers not only to the cross-linking agent 307 but also bonds the two polymers to each other through the cross-linking agent 307, thereby forming a cross-linked polymer 306 with an even larger molecular weight.

By increasing the molecular weight of the polymers through the cross-linking reaction 303, the new cross-linked polymer 306 becomes even less soluble in a developer 501 (not illustrated in FIG. 2 but illustrated and described below with respect to FIG. 5) in the exposed regions 201 of the photoresist 111. By decreasing the solubility of the polymers and, thus, decreasing the solubility of the exposed regions 201 of the photoresist 111, the exposed regions 201 of the photoresist 111 will have a lower rate of dissolution into the developer 501. This lower rate of dissolution improves the line depth of focus, and improves the performance of the photoresist 111.

Figure 4A:
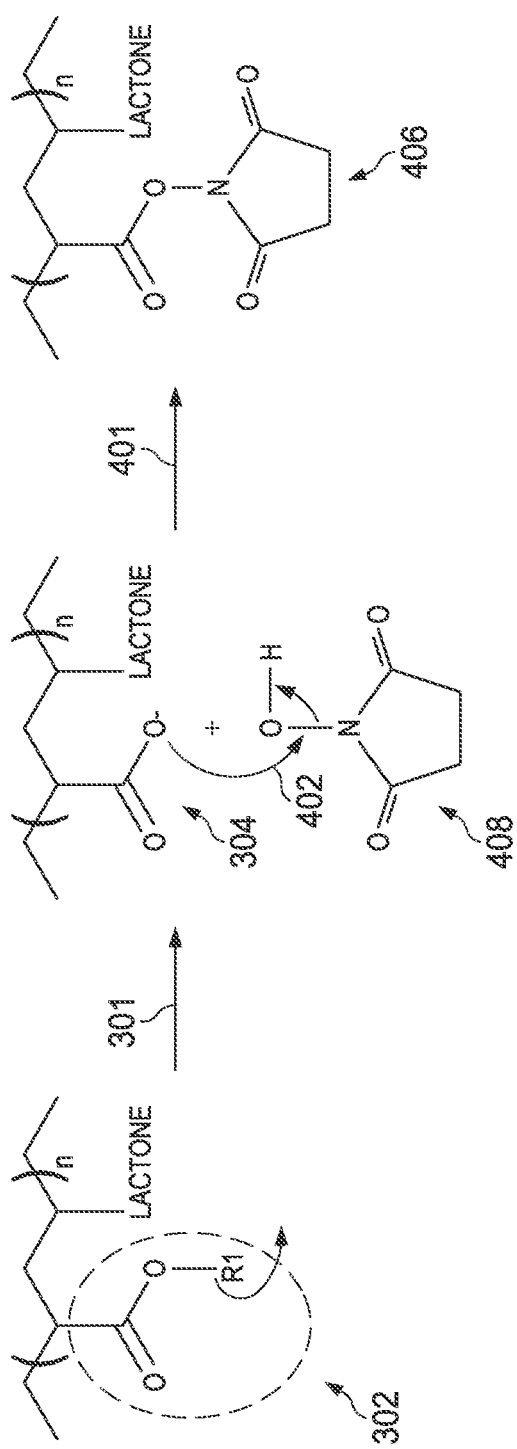

FIG. 4A illustrates one possible chemical mechanism for a first coupling reaction 401 in an embodiment in which the coupling reagent 408 is utilized. In this embodiment the de-protecting reaction 301 of the initial polymer 302 illustrated in FIG. 3 has already occurred to remove the R1 group and to de-protect the carboxylic group in the initial polymer 302. However, instead of replacing the removed group with a hydrogen atom, the coupling reagent 408 (e.g., one of the coupling reagents given as an example above) reacts 402 with the single bonded oxygen atom of the carboxylic group of de-protected polymer 304 in the first coupling reaction 401 to form a coupled polymer 406 as a product of the first coupling reaction 401.

In particular, in the reaction mechanism of this first coupling reaction 401, the single bonded oxygen in the de-protected polymer 304 will break the bond between the nitrogen and the single bonded oxygen within the coupling reagent 408. The nitrogen will then bond with the oxygen within the carboxylic group of the de-protected polymer 304, forming the coupled polymer 406, while the —OH group from the coupling reagent 408 leaves the molecule all together. The result is the coupled polymer 406, wherein the polymer is bonded to the coupling reagent 408 and ready for additional reactions.

FIG. 4B illustrates a reaction mechanism for one such reaction that may occur to the coupled polymer 406. In this embodiment the reaction takes place without the presence of the cross-linking agent 307. In particular, in this reaction the cross-linking agent 307 either has not been added to the photoresist 111 or, in another embodiment, the cross-linking agent 307 has been added, but none of the cross-linking agent 307 is currently available to react with the coupled polymer 406.

As illustrated in FIG. 4B, without the cross-linking agent 307 the coupled polymer 406, and in particular the coupling reagent 408 that is bonded to the polymer within the coupled polymer 406, reacts with a second de-protected polymer 410, such as another one of the polymers within the photoresist 111 that has had a group removed by the $H^+$ protons generated by the PACs during exposure and post-exposure baking in a de-protecting reaction 301 (see, e.g., FIG. 4A), in a second coupling reaction 403. In this second coupling reaction 403 the open oxygen atom of the second de-protected polymer 410 removes the bond between the coupling reagent 408 and the polymer to which the coupling reagent 408 is bonded (represented in FIG. 4B by the line 404), and replaces the coupling reagent 408 by bonding with the polymer to which the coupling reagent 408 was bonded. As such, the coupling reagent 408 is replaced, resulting in a polymer coupled polymer 410 wherein one polymer is directly coupled and bonded to the other polymer, thereby increasing the molecular weight of the bonded polymer.

FIG. 4C illustrates an alternative embodiment that may occur after the coupled polymer 406 has been formed and in which the cross-linking agent 307 is both included within the photoresist 111 as well as being available to react 405 with the coupled polymer 406. In this embodiment the cross-linking agent 307 (instead of a second coupled polymer 410 as described above) will react with, remove, and replace the coupling reagent 408 from the coupled polymer 406 so that the cross-linking agent 307 is bonded to the polymer. The cross-linking agent 307 may do this to two separate coupled polymers 406, thereby bonding and connecting two polymer resins to each other and forming the cross-linked polymer 306 with a larger molecular weight.

Figure 5:
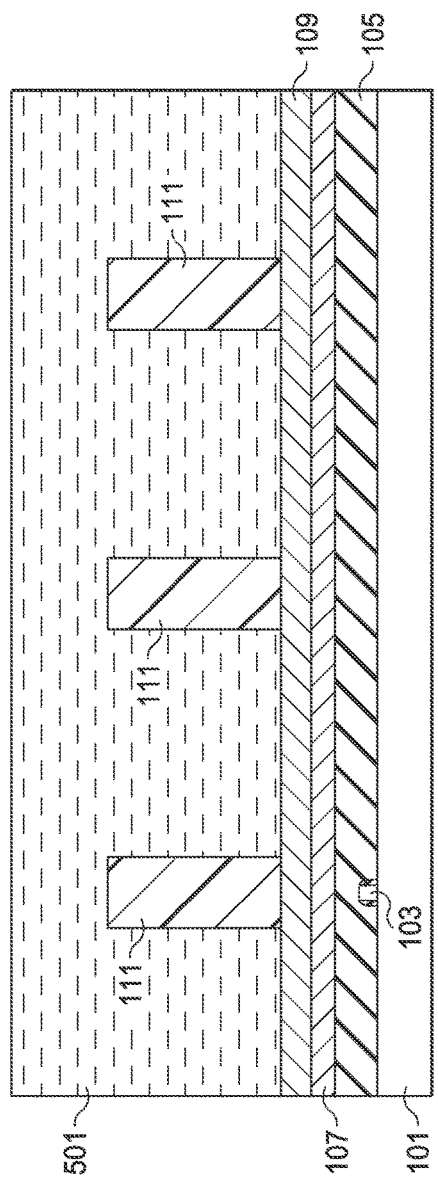
FIG. 5 illustrates a development of the photoresist in accordance with an embodiment.

FIG. 5 illustrates a development of the photoresist 111 after the photoresist 111 has been exposed with the use of a developer 501. In an embodiment the developer 501 is a negative tone developer, such as an organic solvent or critical fluid that may be utilized to remove those portions of the photoresist 111 which were not exposed to the energy and, as such, retain their original solubility. Specific examples of materials that may be utilized include hexane, heptane, octane, toluene, xylene, dichloromethane, chloroform, carbon tetrachloride, trichloroethylene and like hydrocarbon solvents; critical carbon dioxide, methanol, ethanol, propanol, butanol and like alcohol solvents diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether and like ether solvents, acetone, methyl ethyl ketone, methyl isobutyl ketone, isophorone, cyclohexanone and like ketone solvents, methyl acetate, ethyl acetate, propyl acetate, butyl acetate and like ester solvents, pyridine, formamide, N,N-dimethyl formamide and like other solvents.

In an embodiment in which immersion lithography is utilized to expose the photoresist 111 and a protective layer is utilized to protect the photoresist 111 from the immersion medium, the developer 501 may be chosen to remove not only those portions of the photoresist 111 that are desired to be removed, but may also be chosen to remove the protective layer in the same development step. Alternatively, the protective layer may be removed in a separate process, such as by a separate solvent from the developer 501 or even an etching process to remove the protective layer from the photoresist 111 prior to development.

The developer 501 may be applied to the photoresist 111 using, e.g., a spin-on process. In this process the developer 501 is applied to the photoresist 111 from above the photoresist 111 while the semiconductor device 100 (and the photoresist 111) is rotated. In an embodiment the developer 501 may be supplied at a rate of between about 5 ml/min and about 800 ml/min, such as about 300 ml/min, while the semiconductor device 100 is being rotated at a speed of between about 100 rpm and about 2000 rpm, such as about 1000 rpm. In an embodiment the developer 501 may be at a temperature of between about 10° C. and about 80° C., such as about 50° C., and the development may continue for between about 1 minute to about 60 minutes, such as about 30 minutes.

However, while the spin-on method described herein is one suitable method for developing the photoresist 111 after exposure, it is intended to be illustrative and is not intended to limit the embodiment. Rather, any suitable method for development, including dip processes, puddle processes, and spray-on methods, may alternatively be used. All such development processes are fully intended to be included within the scope of the embodiments.

During the development process, the developer will dissolve the unexposed regions 203, which did not have any patterned energy 215 impinge upon it and, as such, did not have its solubility modified. Additionally, the inclusion of the cross-linking agent 307 and the coupling reagent 408 have modified the polymers (e.g., by forming the cross-linked polymers 306; see FIG. 3) within the exposed regions 201 of the photoresist 111 so that the polymers, in addition to having their solubility modified by the exposure, also have a larger molecular weight. This larger molecular weight makes the exposed region 201 even less soluble in the developer 501, and helps to reduce the dissolution rate of the exposed region 201 in the developer 501. As such, less of the exposed region 201 will dissolve in the developer 501, leaving behind a photoresist 111 that has a larger and better definition than previously possible.

Figure 6:
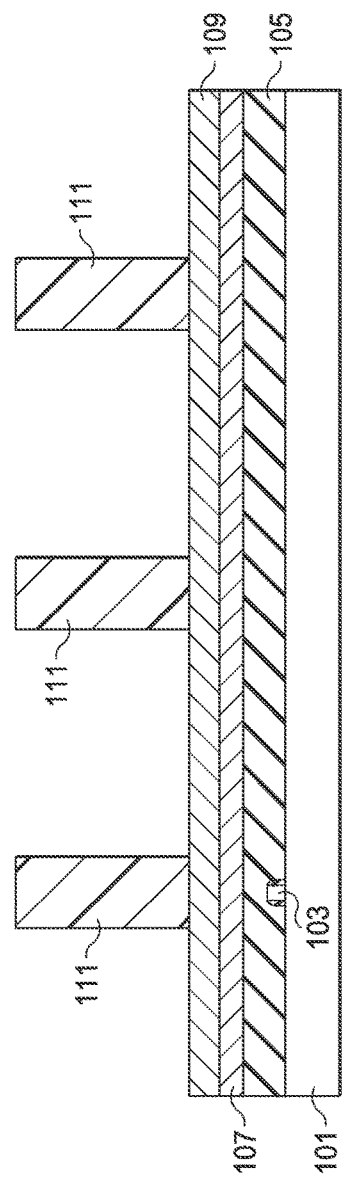
FIG. 6 illustrates a removal of the developer in accordance with an embodiment.

FIG. 6 illustrates a removal of the developer 501 and the photoresist 111 after it has been developed with the developer 501. In an embodiment the developer 501 may be removed using, e.g., a spin-dry process, although any suitable removal technique may alternatively be utilized. After the photoresist 111 has been developed additional processing may be performed on the layer to be patterned 109 while the photoresist 111 is in place. As one example, a reactive ion etch or other etching process may be utilized, to transfer the pattern of the photoresist 111 to the underlying layer to be patterned 109. Alternatively, in an embodiment in which the layer to be patterned 109 is a seed layer, the layer to be patterned 109 may be plated in order to form, e.g., a copper pillar, or other conductive structure in the opening of the photoresist 111. Any suitable processing, whether additive or subtractive, that may be performed while the photoresist 111 is in place may be performed, and all such additional processing are fully intended to be included within the scope of the embodiments.

Figure 7:
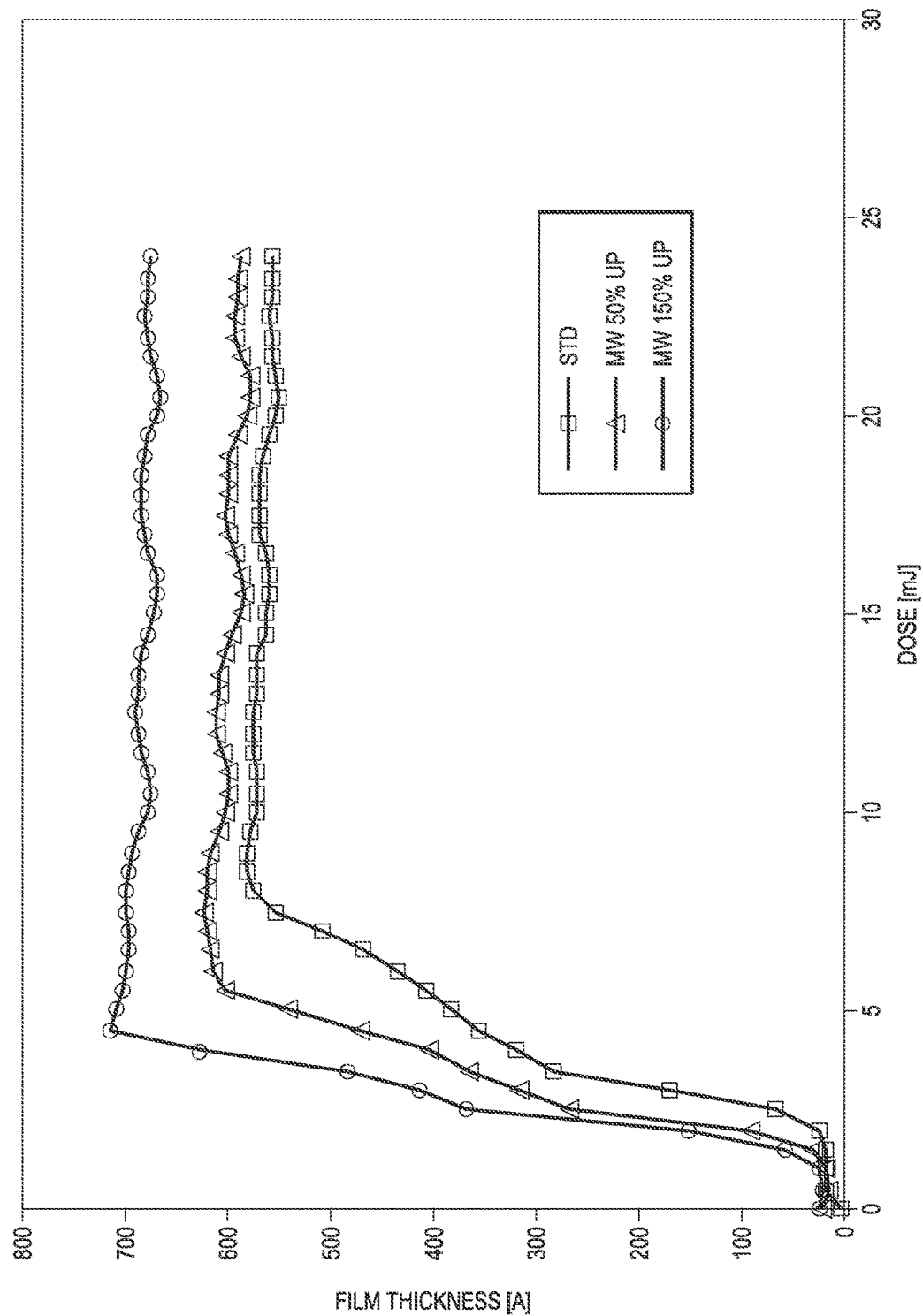
FIG. 7 illustrates a chart illustrating a lower dissolution rate for higher molecular weight polymers in accordance with an embodiment.

FIG. 7 illustrates improvements that may be achieved by increasing the molecular weight of the photo-resist 111. In this chart are three different molecular weights of the polymer represented by lines with squares, lines with crosses, and lines with circles, which indicate the standard molecular weight, the molecular weight increased by 50%, and the molecular weight times 1.5 (which is respectively 150%), respectively. In this chart of a development rate monitor (DRM), the tested photoresists had an original thickness of 1000 Å, were exposed at exposures dosages plotted (on the X axis) and were then developed for a fixed development time. After development, the thickness of the remaining photoresist were determined and charted along the Y axis to determine a dissolution rate during the development process, with a higher film thickness indicating a lower dissolution rate and a smaller film thickness indicating a higher dissolution rate. As illustrated, when the molecular weight goes up the dissolution rate of the exposed region goes down and causes a thicker film to remain on the substrate after the development process. Lowering the dissolution rate can not only provide a better definition of the photoresist but also improves the contrast, and that leads to a better depth of focus.

In accordance with an embodiment, a method for manufacturing a semiconductor device comprising applying a photoresist to a substrate, the photoresist comprising a resin, the resin comprising a plurality of polymer resins and exposing the photoresist to a patterned energy, the patterned energy inducing a reaction that bonds a first one of the plurality of polymer resins to a second one of the plurality of polymer resins is provided. The photoresist is developed after the exposing the photoresist, the developing being performed with a negative tone developer.

In accordance with an embodiment, a method for manufacturing a semiconductor device comprising applying a photoresist to a substrate, the photoresist comprising a resin, the resin comprising a plurality of polymers, each one of the plurality of polymers comprising a backbone, is provided. The photoresist is exposed to a patterned energy, the patterned energy inducing a reaction to form a bond between a backbone of a first one of the plurality of polymers and a backbone of a second one of the plurality of polymers, and the photoresist is developed after the exposing the photoresist, the developing being performed with a negative tone developer.

In accordance with another embodiment, a method of manufacturing a semiconductor device comprising dispensing a photoresist onto a substrate, the photoresist comprising a resin and a photoactive compound, and exposing the photoresist to an energy source, the exposing the photoresist bonding a first polymer of the resin to a second polymer of the resin, is provided. The photoresist is developed with a negative tone developer after the bonding the first polymer of the resin to the second polymer of the resin.

In accordance with yet another embodiment, a negative tone photoresist comprising a polymer resin within the negative tone photoresist is provided. A photoactive compound and a cross-linking agent 307 are also in the negative tone photoresist.

Although the present embodiments and their advantages have been described in detail, it should be understood that various changes, substitutions, and alterations can be made herein without departing from the spirit and scope of the disclosure as defined by the appended claims. For example, many different processes may be utilized to form, apply, and develop the photoresist, and many different processes may be utilized to form, apply, and remove the slimming agents.

Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:
1. A photoresist comprising:
a resin;
a photoactive compound; and
a cross-linking agent, wherein the cross-linking agent has a structure of:

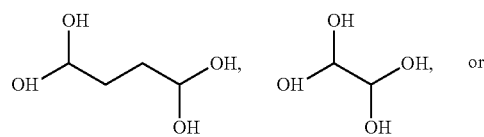

-continued

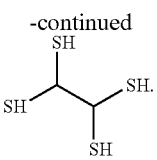

2. The photoresist of claim 1, further comprising a coupling reagent.

3. The photoresist of claim 2, wherein the coupling reagent has a structure of:

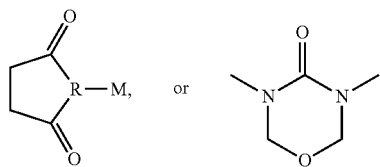

wherein: R is carbon, nitrogen or sulfur; and M comprises chlorine, bromine, iodine, —NO$_2$, —SO$_3$—, —CN, —NCO, —OCN, —CO$_2$—, or epoxide.

4. The photoresist of claim 1, wherein the resin comprises at least one of an acrylic ester, a methacrylic ester, a crotonic ester, a vinyl ester, a maleic diester, a fumaric diester, an itaconic diester, a (meth)acrylonitrile, a (meth)acrylamide, a styrene, and a vinyl ether.

5. The photoresist of claim 1, wherein the photoactive compound comprises at least one of a halogenated triazine, an onium salt, a diazonium salt, an aromatic diazonium salt, a phosphonium salt, asulfonium salt, an iodonium salt, an imide sulfonate, an oxime sulfonate, a diazodisulfone, a disulfone, an o-nitrobenzylsulfonate, a sulfonated ester, a halogenated sulfonyloxy dicarboximide, a diazodisulfone, an α-cyanooxyamine-sulfonate, an imidesulfonate, a keto-diazosulfone, a sulfonyldiazoester, a 1,2-di(arylsulfonyl) hydrazine, anitrobenzyl ester, and a s-triazine.

6. The photoresist of claim 1, further comprising an organic solvent selected from the group consisting of ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, and alkylene glycol monoalkyl esters.

7. A photoresist comprising:
a resin;
a cross-linking agent having a structure of

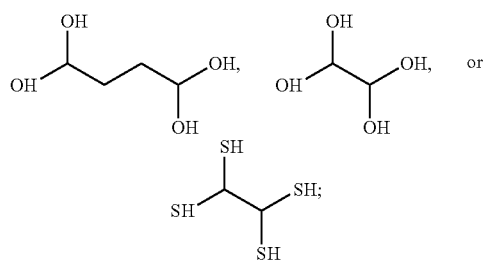

a coupling reagent, wherein the coupling reagent has a structure of:

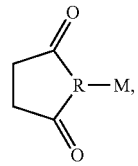

wherein: R is carbon, nitrogen or sulfur; and M comprises chlorine, bromine, iodine, —NO$_2$, —SO$_3$—, —CN, —NCO, —OCN, —CO$_2$—, or epoxide; and
a photoactive compound.

8. The photoresist of claim 7, wherein the cross-linking agent has the structure of

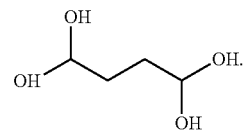

9. The photoresist of claim 7, wherein the coupling reagent has a structure of:

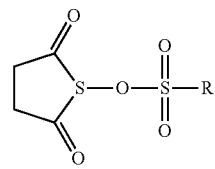

where R is a carbon atom.

10. The photoresist of claim 7, wherein the resin comprises at least one of an acrylic ester, a methacrylic ester, a crotonic ester, a vinyl ester, a maleic diester, a fumaric diester, an itaconic diester, a (meth)acrylonitrile, a (meth)acrylamide, a styrene, and a vinyl ether.

11. The photoresist of claim 7, wherein the photoactive compound comprises at least one of a halogenated triazine, an onium salt, a diazonium salt, an aromatic diazonium salt, a phosphonium salt, asulfonium salt, an iodonium salt, an imide sulfonate, an oxime sulfonate, a diazodisulfone, a disulfone, an o-nitrobenzylsulfonate, a sulfonated ester, a halogenated sulfonyloxy dicarboximide, a diazodisulfone, an α-cyanooxyamine-sulfonate, an imidesulfonate, a keto-diazosulfone, a sulfonyldiazoester, a 1,2-di(arylsulfonyl) hydrazine, anitrobenzyl ester, and a s-triazine.

12. The photoresist of claim 7, further comprising an organic solvent selected from the group consisting of ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, and alkylene glycol monoalkyl esters.

13. A photoresist comprising:
a resin;
a cross-linking agent;
a coupling reagent, wherein the coupling reagent has a structure of:

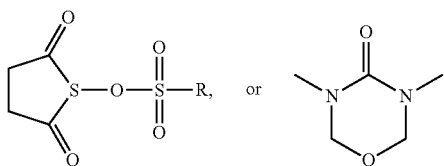

where R is a carbon atom; and
a photoactive compound.

14. The photoresist of claim 13, wherein the cross-linking agent has a structure of

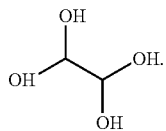

15. The photoresist of claim 13, wherein the cross-linking agent has a structure of

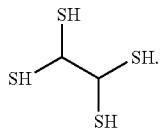

16. The photoresist of claim 13, wherein the cross-linking agent has a structure of

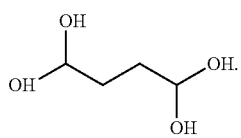

17. The photoresist of claim 13, wherein the resin comprises at least one of an acrylic ester, a methacrylic ester, a crotonic ester, a vinyl ester, a maleic diester, a fumaric diester, an itaconic diester, a (meth)acrylonitrile, a (meth)acrylamide, a styrene, and a vinyl ether.

18. The photoresist of claim 13, wherein the photoactive compound comprises at least one of a halogenated triazine, an onium salt, a diazonium salt, an aromatic diazonium salt, a phosphonium salt, asulfonium salt, an iodonium salt, an imide sulfonate, an oxime sulfonate, a diazodisulfone, a disulfone, an o-nitrobenzylsulfonate, a sulfonated ester, a halogenerated sulfonyloxy dicarboximide, a diazodisulfone, an α-cyanooxyamine-sulfonate, an imidesulfonate, a keto-diazosulfone, a sulfonyldiazoester, a 1,2-di(arylsulfonyl) hydrazine, anitrobenzyl ester, and a s-triazine.

19. The photoresist of claim 13, further comprising an organic solvent selected from the group consisting of ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, and alkylene glycol monoalkyl esters.

* * * * *